United States Patent
Mataln et al.

(10) Patent No.: US 10,658,309 B2
(45) Date of Patent: May 19, 2020

(54) SEMICONDUCTOR DEVICE WITH COMPRESSIVE INTERLAYER

(71) Applicant: Infineon Technologies AG, Neubiberg (DE)

(72) Inventors: Marianne Mataln, Villach (AT);
Michael Nelhiebel, Villach (AT);
Rainer Pelzer, Wernberg (AT);
Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/418,006

(22) Filed: May 21, 2019

(65) Prior Publication Data

US 2019/0273050 A1 Sep. 5, 2019

Related U.S. Application Data

(63) Continuation of application No. 15/686,576, filed on Aug. 25, 2017, now Pat. No. 10,304,782.

(51) Int. Cl.
*H01L 23/00* (2006.01)
*H01L 23/58* (2006.01)
*B81B 7/00* (2006.01)

(52) U.S. Cl.
CPC .......... *H01L 23/562* (2013.01); *B81B 7/0006* (2013.01); *H01L 23/585* (2013.01);
(Continued)

(58) Field of Classification Search
CPC .................................................... H01L 23/562
(Continued)

(56) References Cited

U.S. PATENT DOCUMENTS 4,988,423 A * 1/1991 Yamamoto ........ H01L 21/76877
204/192.17
5,578,522 A 11/1996 Nakamura et al.
(Continued)

FOREIGN PATENT DOCUMENTS

DE 102004059389 A1 6/2006
DE 102010061189 A1 6/2011
(Continued)

OTHER PUBLICATIONS

Joshi, Ravi, et al., "Power Metallization Structure for Semiconductor Devices", U.S. Appl. No. 16/048,667, filed Jul. 30, 2018.

*Primary Examiner* — Jami Valentine Miller
(74) *Attorney, Agent, or Firm* — Murphy, Bilak & Homiller, PLLC

(57) ABSTRACT

A semiconductor device includes a substrate, a structured interlayer on the substrate and having a defined edge, and a structured metallization on the structured interlayer and also having a defined edge. The defined edge of the structured interlayer faces the same direction as the defined edge of the structured metallization. The defined edge of the structured interlayer extends beyond the defined edge of the structured metallization by at least 0.5 microns so that the defined edge of the structured metallization terminates before reaching the defined edge of the structured interlayer. The structured interlayer has a compressive residual stress at room temperature and the structured metallization generates a tensile stress at room temperature that is at least partly counteracted by the compressive residual stress of the structured interlayer.

27 Claims, 7 Drawing Sheets

(52) U.S. Cl.
CPC .............. *H01L 24/11* (2013.01); *H01L 24/13* (2013.01); *H01L 2224/1132* (2013.01); *H01L 2224/1162* (2013.01); *H01L 2224/11614* (2013.01); *H01L 2224/13017* (2013.01); *H01L 2224/13082* (2013.01); *H01L 2224/13124* (2013.01); *H01L 2224/13144* (2013.01); *H01L 2224/13147* (2013.01); *H01L 2224/13166* (2013.01); *H01L 2224/13184* (2013.01); *H01L 2924/1033* (2013.01); *H01L 2924/10253* (2013.01); *H01L 2924/10272* (2013.01); *H01L 2924/3512* (2013.01)

(58) Field of Classification Search
USPC .......................................................... 257/737
See application file for complete search history.

(56) References Cited

U.S. PATENT DOCUMENTS

| | | | |
|---|---|---|---|
| 6,020,640 | A | 2/2000 | Efland et al. |
| 6,544,880 | B1 | 4/2003 | Akram |
| 6,576,539 | B1 | 6/2003 | Lin |
| 7,071,537 | B2 | 7/2006 | Kelberlau et al. |
| 7,122,902 | B2 | 10/2006 | Hatano et al. |
| 9,196,560 | B2 | 11/2015 | Roth et al. |
| 9,397,022 | B2 | 7/2016 | Roth et al. |
| 2001/0036804 | A1* | 11/2001 | Mueller .................. B24B 37/24 451/526 |
| 2002/0149118 | A1 | 10/2002 | Yamaguchi et al. |
| 2002/0149958 | A1* | 10/2002 | Kunikiyo .............. H01L 27/115 365/51 |
| 2003/0183913 | A1 | 10/2003 | Robl et al. |
| 2005/0179068 | A1 | 8/2005 | Rueb et al. |
| 2005/0239277 | A1 | 10/2005 | Mercer et al. |
| 2005/0258484 | A1 | 11/2005 | Itou |
| 2007/0222087 | A1 | 9/2007 | Lee et al. |
| 2010/0207237 | A1 | 8/2010 | Yao et al. |
| 2010/0314725 | A1 | 12/2010 | Gu et al. |
| 2012/0235278 | A1 | 9/2012 | Shigihara et al. |
| 2013/0203214 | A1* | 8/2013 | Isobe .................. H01L 21/0237 438/104 |
| 2014/0061823 | A1 | 3/2014 | Kam et al. |
| 2015/0115391 | A1 | 4/2015 | Roth et al. |
| 2015/0348987 | A1* | 12/2015 | Lee .................. H01L 27/11573 257/326 |
| 2017/0098620 | A1 | 4/2017 | Roth et al. |
| 2018/0350760 | A1 | 12/2018 | Usami |

FOREIGN PATENT DOCUMENTS

| | | |
|---|---|---|
| DE | 102015219183 A1 | 4/2017 |
| DE | 102016122318 A1 | 5/2018 |
| WO | 2016024946 A1 | 2/2016 |

* cited by examiner

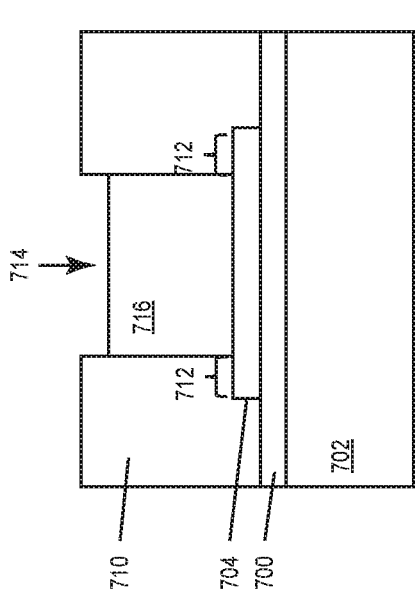
*Figure 8D*
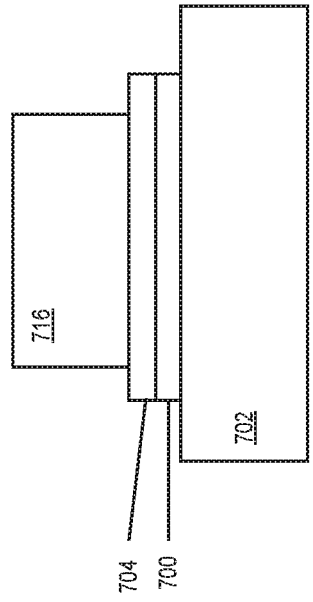
*Figure 8E*
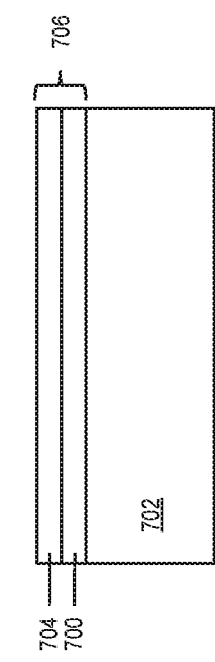
*Figure 8A*
*Figure 8B*
*Figure 8C*

SEMICONDUCTOR DEVICE WITH COMPRESSIVE INTERLAYER

TECHNICAL FIELD

The present application relates to semiconductor devices, in particular preventing crack propagation from metallization edges of a semiconductor device.

BACKGROUND

When thick (e.g. >5 μm) and stiff (high E-modulus/high yield stress) metallization stacks such as thick Cu, Al and Au power metals are introduced into a semiconductor device e.g. to enable particular interconnect solutions or improve thermal performance, high stresses occur near any film-terminating free-edge of the metal layer as a result of any sufficiently large temperature change. Such stresses occur due to the mismatch in the coefficients of thermal expansion (CTE) between the metal film and the underlying substrate (e.g. semiconductor materials or interlevel dielectrics). Temperature changes can occur during device processing (e.g. during cool-down to room temperature after an annealing step) or during use of the final device (e.g. power dissipation during switching operation under overload conditions). Free edges are created by the requirement of a patterned power metallization having defined lines and plates of limited size.

Whenever tensile stresses occur below the metal edge and hence in the substrate (e.g. SiO2- or Si3N4-based interlevel dielectrics, or the semiconductor substrate itself), cracks can result in the underlying brittle layers. This is in general the case during cool-down phases, e.g. from annealing at typically 400° C. down to room-temperature, if the CTE of the film is larger than that of the substrate, which is practically always the case.

To avoid cracks during production, either the temperature budget is reduced after deposition of the metal (e.g., to 300° C. anneal), or metals with reduced stiffness are utilized (e.g. aluminum with lower yield stress instead of harder copper). Both measures severely limit the technology, and may result in adverse side effects. Hence, improved crack-stop measures are desired.

SUMMARY

According to an embodiment of a semiconductor device, the semiconductor device comprises a substrate, a structured interlayer on the substrate and a structured metallization on the structured interlayer. The structured interlayer has a defined edge, as does the structured metallization. The defined edge of the structured interlayer faces the same direction as the defined edge of the structured metallization. The defined edge of the structured interlayer extends beyond the defined edge of the structured metallization by at least 0.5 microns so that the defined edge of the structured metallization terminates before reaching the defined edge of the structured interlayer. The structured interlayer has a compressive residual stress at room temperature and the structured metallization generates a tensile stress at room temperature that is at least partly counteracted by the compressive residual stress of the structured interlayer.

According to an embodiment of a method of manufacturing a semiconductor device, the method comprises: forming a structured interlayer on a substrate, the structured interlayer having a defined edge; and forming a structured metallization on the structured interlayer, the structured metallization having a defined edge which faces the same direction as the defined edge of the structured interlayer, wherein the structured interlayer is formed so that the defined edge of the structured interlayer extends beyond the defined edge of the structured metallization by at least 0.5 microns and the defined edge of the structured metallization terminates before reaching the defined edge of the structured interlayer, and wherein the structured interlayer has a compressive residual stress at room temperature and the structured metallization generates a tensile stress at room temperature that is at least partly counteracted by the compressive residual stress of the structured interlayer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 8A through 8E illustrate still another embodiment of a method of manufacturing a semiconductor device having a structured, compressive interlayer with a defined crack-stop edge extension.

DETAILED DESCRIPTION

The embodiments described herein provide a structured, compressive interlayer having a defined crack-stop edge extension. The structured interlayer reduces crack probability without necessitating a change in temperature profile of the device manufacturing process, the properties of the overlying metallization, or the topology of the underlying substrate. This is achieved by placing a robust, high-fracture strength structured interlayer of suitable thickness and compressive residual stress at room temperature between the overlying metal and the underlying brittle layers. The structured interlayer extends by a defined amount, also referred to herein as overlap, beyond the defined edges of the overlying metal. The structured interlayer spreads the tensile stress emanating from the defined edges of the metallization, thereby reducing the peak stress in the underlying substrate. The compressive residual stress of the structured interlayer counteracts the tensile stress caused by cool-down, and thus acts against cracking (the fracture strength of brittle materials being generally much larger under compression than under tension). The structured interlayer effectively decouples the metallization edge from the substrate and the substrate topology by a fixed extension (overlap). Hence, a crack-critical topology (e.g. a substrate surface with grooves) is either covered and hence protected by the stress-distributing layer, or when not covered, is provided with a safe overlap distance from the free metal edge.

Figure 1:
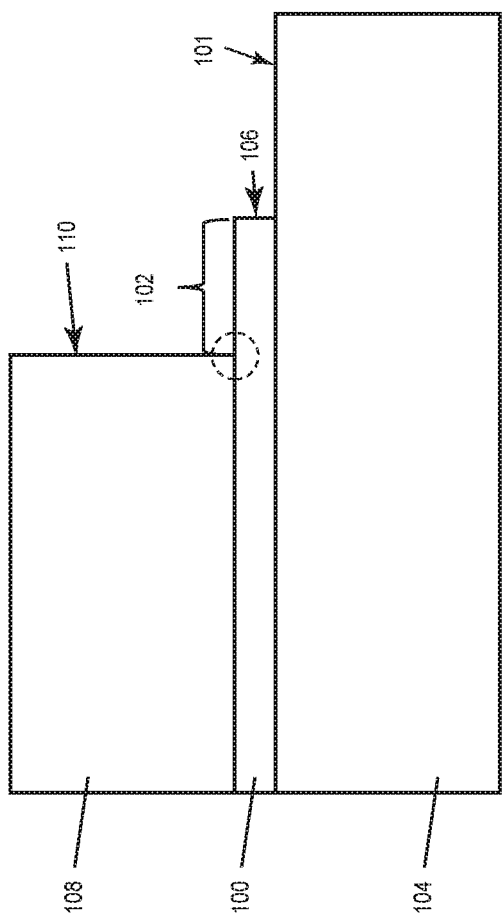
FIG. 1 illustrates a partial sectional view of an embodiment of a semiconductor device having a structured, compressive interlayer with a defined crack-stop edge extension.

FIG. 1 illustrates a partial sectional view of a semiconductor device having a structured, compressive interlayer 100 with a defined crack-stop edge extension 102.

Figure 2:
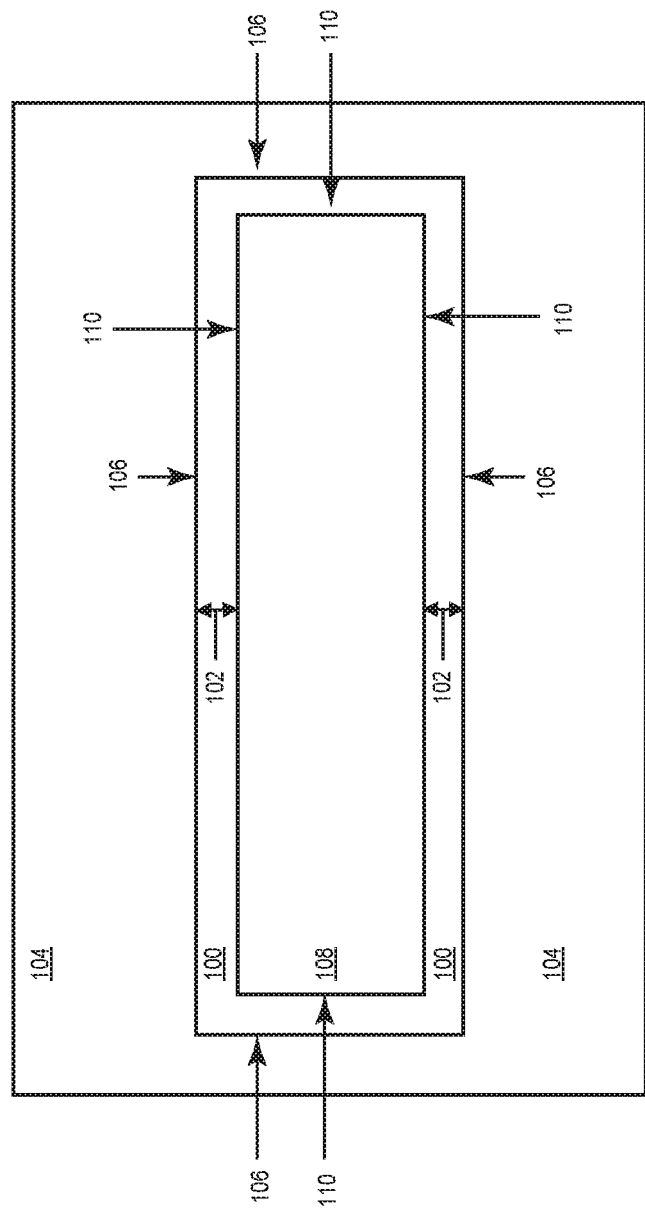
FIG. 2 shows a corresponding top-down plan view of the part of the semiconductor device shown in FIG. 1.

FIG. 2 shows a corresponding top-down plan view of the part of the semiconductor device shown in FIG. 1.

The structured interlayer 100 is formed on a substrate 104, and has defined edges 106. In one embodiment, the underlying substrate 104 is a semiconductor substrate such as Si, GaN on Si, GaN on SiC, GaN on sapphire, SiC, etc. In another embodiment, the underlying substrate 104 is an interlevel dielectric such as an $SiO_2$-based interlevel dielectric, an $Si_3N_4$-based interlevel dielectric, etc. In either case, the semiconductor device also has a structured metallization 108 on the structured interlayer 100. The metallization 108 can be structured (patterned) as desired, and has defined edges 110. The structured metallization 108 together with the structured interlayer 100 can be applied over the front or back side of the substrate 104. The structured metallization 108 can comprise a single layer or multiple (more than one) layers of metal. In some cases, the structured metallization 108 is a thick (e.g. >5 μm) and stiff (high E-modulus/high yield stress) metallization such as thick Cu, Al or Au power metal for a power semiconductor device. However, the structured metallization 108 need not be a power metallization layer of a power semiconductor device, but may instead be thinner e.g. in the case of advanced CMOS designs.

Various metallization/interlayer combinations are contemplated. For example, the structured metallization 108 can comprise Cu and the structured interlayer 100 can comprise at least one of Ti, TiW, W and Ta. In another embodiment, the structured metallization 108 comprises Al or an Al alloy and the structured interlayer 100 comprises at least one of Ti, TiN and W. In yet another embodiment, the structured metallization 108 comprises Au and the structured interlayer 100 comprises any suitable barrier layer and/or adhesion promotion layer compatible with Au. A common barrier layer for at least Cu and Al metal systems is TiW, which can be compressive or tensile depending on the choice of deposition parameters. Hence, if the structured interlayer 100 comprises a single layer of TiW, the TiW layer should be deposited so as to have a compressive residual stress at room temperature. Still other metallization/interlayer combinations are possible.

In each case, the structured interlayer 100 has an overall compressive residual stress at room temperature. For example, the structured interlayer 100 can comprise a single layer having a compressive residual stress at room temperature. In another embodiment, the structured interlayer 100 can comprise a combination of tensile and compressive layers but in total has an overall compressive residual stress at room temperature. For example, at least one layer can have a compressive residual stress at room temperature and at least one other layer can have a tensile residual stress at room temperature. However, the overall residual stress of such a composite structured interlayer 100 is still compressive at room temperature despite the presence of one or more tensile layers.

Regardless of the metallization/interlayer combination and type of semiconductor device (power device, logic device, etc.), each defined edge 106 of the structured interlayer 100 neighbors one of the defined edges 110 of the structured metallization 108 and runs in the same direction as the neighboring defined edge 110 of the structured metallization 108. Each defined edge 106 of the structured interlayer 100 extends beyond the neighboring defined edge 110 of the structured metallization 108 by at least 0.5 microns, so that each defined edge 110 of the structured metallization 108 terminates before reaching the neighboring defined edge 106 of the structured interlayer 100. Hence, the structured interlayer 100 looks like a flange in the top plan view of FIG. 2 in that the structured interlayer 100 projects further outward laterally than the structured metallization 108 and each defined edge 110 of the structured metallization 108 terminates before reaching the neighboring edge 106 of the structured interlayer 100.

The amount by which each defined edge 106 of the structured interlayer 100 extends beyond the neighboring defined edge 110 of the structured metallization 108 is a function of the thickness and yield stress of the structured metallization 108. In one embodiment, each defined edge 106 of the structured interlayer 100 extends beyond the neighboring defined edge 110 of the structured metallization 108 by more than 0.5 microns and less than 15 microns. For example, each defined edge 106 of the structured interlayer 100 can extend beyond the neighboring defined edge 110 of the structured metallization 108 by at least 1 micron. In the case of a planar substrate surface 101 on which the structured interlayer 100 is formed, each defined edge 106 of the structured interlayer 100 can extend beyond the neighboring defined edge 110 of the structured metallization 108 by at least 0.5 microns and less than 5 microns, or by at least 0.5 microns and less than 10 microns, etc. In the case of a nonplanar substrate surface 101 on which the structured interlayer 100 is formed, each defined edge 106 of the structured interlayer 100 can extend beyond the neighboring defined edge 110 of the structured metallization 108 by at least 2 microns and less than 15 microns, or by at least 2 microns and less than 30 microns, etc. For example, each defined edge 106 of the structured interlayer 100 can extend beyond the neighboring defined edge 110 of the structured metallization 108 by at least 4 microns and less than 15 microns. Even larger extensions for planar and non-planar substrate surfaces are contemplated.

Figure 4:
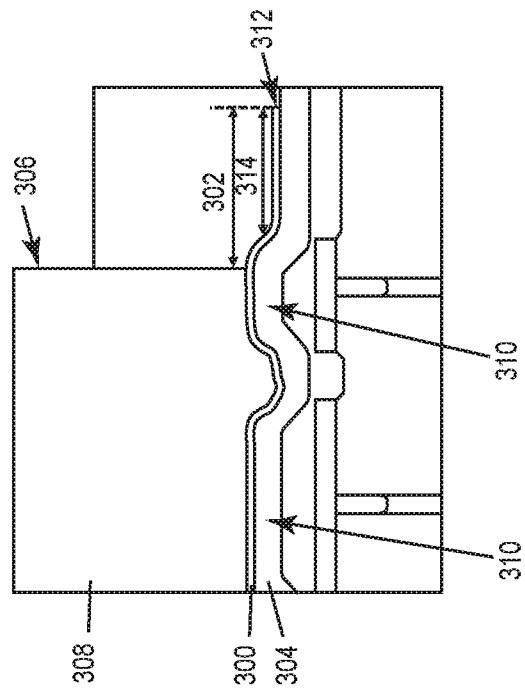
FIG. 4 illustrates a partial sectional view of yet another embodiment of a semiconductor device having a structured, compressive interlayer with a defined crack-stop edge extension.
Figure 3:
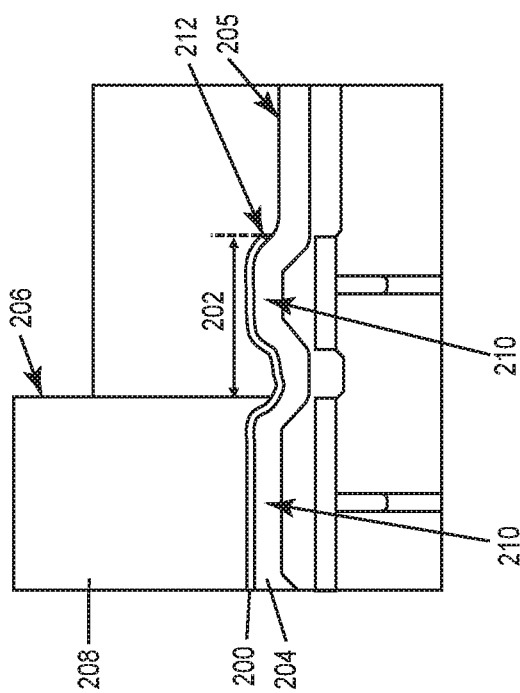
FIG. 3 illustrates a partial sectional view of another embodiment of a semiconductor device having a structured, compressive interlayer with a defined crack-stop edge extension.

The length of the defined crack-stop edge extension 102 of the structured interlayer 100 can differ depending on whether the structured interlayer 100 in combination with the structure metallization 108 are applied to the front or back side of the substrate 108. FIGS. 3 and 4 described later herein show the structured interlayer 100 in combination with the structure metallization 108 applied to the front side of the substrate 108. In the case of being applied to the back side of the substrate 104, the structured metallization 108 may comprise metal plates such as copper plates on the substrate back side. Alignment precision for such metal plates is poor, since the back-side lithography is commonly aligned to front-side structures, resulting in large tolerance e.g. in the range of 10 microns to 30 microns. Each defined edge 106 of the structured interlayer 100 can extend by a sufficiently large amount beyond the edges 110 of the structured metallization 108 on the substrate back side to mitigate cracking. For example, each defined edge 106 of the structured interlayer 100 can extend by 2 microns to 15 microns, 10 microns to 100 microns, or up to 10% of the lateral dimension of the structured metallization 108 in the direction perpendicular to the defined edges 110 of the structured metallization 108, etc. In the case of relatively large metal plates e.g. typically 500×1000 um$^2$ metal plates, the structured interlayer 100 could overlap by about 50 microns to 100 microns.

The structured metallization 108 and the structured interlayer 100 are illustrated with simple rectangular shapes for ease of illustration in the top-down plan view of FIG. 2. In general, the structured metallization 108 and the structured interlayer 100 may have any shape such as, but not limited to, square, rectangular, linear, rectilinear, curved, meandering, etc. Also in FIG. 2, the defined crack-stop edge extension 102 of the structured interlayer 100 need not be equal size along all defined edges 110 of the structured metallization 108, thus allowing for area optimization (less extension) at less critical locations and maximum crack-risk prevention (more extension) at more critical locations. For example, the defined crack-stop edge extension 102 of the structured interlayer 100 may be smaller (less overlap) along edges 110 of the structured metallization 108 less likely to cause cracking and larger (more overlap) along edges 110 of the structured metallization 108 more likely to cause cracking. The size of the defined crack-stop edge extension 102 along the defined edges 110 of the structured metallization 108 can also depend on the topology of the substrate 104. For example, the defined crack-stop edge extension 102 of the structured interlayer 100 may be smaller (less overlap) over planar portions of the substrate surface and larger (more overlap) over non-planar portions of the surface.

Because of the compressive nature of the structured interlayer 100 and the 0.5 micron or greater lateral extension 102 beyond the defined edges 110 of the structured metallization 108, the interlayer 100 reduces crack probability in the underlying substrate 104. During cooling of the structured metallization 108, the metallization 108 becomes tensile and pulls back, imparting stress. The greatest degree of stress occurs along the edge interface with the structured interlayer 100 which is indicated by the dashed curved line in FIG. 1. However, the defined crack-stop edge extension 102 of the structured interlayer 100 combined with the compressive nature of the interlayer 100 at room temperature yields a counter stress. As a result, tensile stresses underneath the metallization-interlayer terminating edge are significantly reduced. Significant stress reduction is realized for both planar and non-planar substrate surfaces.

FIG. 3 illustrates a partial sectional view of another semiconductor device having a structured, compressive interlayer 200 with a defined crack-stop edge extension 202. According to this embodiment, the substrate 204 has a non-planar surface 205 on which the structured interlayer 200 is formed and some of the defined edges 206 of the structured metallization 208 terminate between raised features 210 of the non-planar surface 205. Each defined edge 212 of the structured interlayer 200 neighboring a defined edge 206 of the structured metallization 208 that terminates between raised features 210 of the non-planar surface 205 extends beyond that neighboring defined edge 206 of the structured metallization 208 by at least 3 microns, e.g. by at least 4 microns.

FIG. 4 illustrates a partial sectional view of yet another semiconductor device having a structured, compressive interlayer 300 with a defined crack-stop edge extension 302. According to this embodiment, the substrate 304 has a non-planar surface on which the structured interlayer 300 is formed and some of the defined edges 306 of the structured metallization 308 terminate over raised features 310 of the non-planar surface instead of between the raised features 310. Each defined edge 312 of the structured interlayer 300 neighboring a defined edge 306 of the structured metallization 308 that terminates over a raised feature 310 of the non-planar surface extends beyond that neighboring defined edge 306 of the structured metallization 308 by at least 3 microns, e.g. by at least 4 microns. In some cases, each defined edge 312 of the structured interlayer 300 neighboring a defined edge 306 of the structured metallization 308 that terminates over a raised feature 310 of the non-planar surface extends beyond that raised feature 310 of the non-planar surface as indicated by reference number 314 in FIG. 4.

Figure 5C:
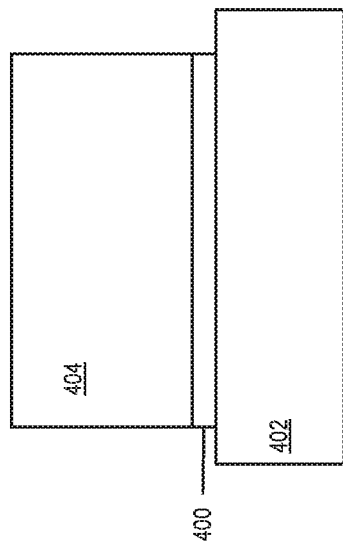
FIGS. 5A through 5D illustrate an embodiment of a method of manufacturing a semiconductor device having a structured, compressive interlayer with a defined crack-stop edge extension.
Figure 5D:
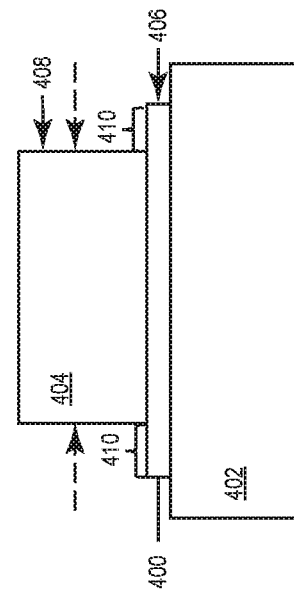
Figure 5A:
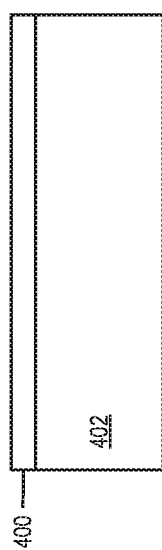
Figure 5B:
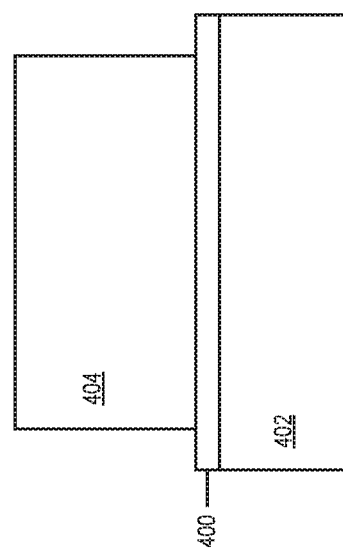

FIGS. 5A through 5D illustrate an embodiment of a method of manufacturing a semiconductor device having a structured, compressive interlayer with a defined crack-stop edge extension. According to this embodiment, the compressive interlayer is structured by selective metal etch after metal deposition and patterning. In FIG. 5A, an interlayer material system 400 is deposited on a substrate 402. The interlayer material system 400 comprises one or more material layers and has an overall compressive residual stress at room temperature. In FIG. 5B, metal 404 such as Cu, Al, Au, etc. is deposited and patterned (e.g. by standard lithography) on the interlayer material system 400. In FIG. 5C, the deposited and structured metal 404 is used as a mask to remove the part of the interlayer material system 400 unprotected by the deposited and structured metal 404. Any standard selective etching process can be used to remove the exposed parts of the interlayer material system 400. In FIG. 5D, the deposited and structured metal 404 is etched laterally selective to the interlayer material system 400 as indicated by the inward-facing dashed lines, so that each defined edge 406 of the interlayer material system 400 extends beyond the neighboring defined edge 408 of the deposited and structured metal 404 by at least 0.5 microns. Here, the degree of lateral etch-back of the deposited and structured metal 404 determines the length of crack-stop edge extension 410 as shown in FIG. 5D. Any standard selective metallization etching process can be used to form the crack-stop edge extension 410 of the structured interlayer 402.

Figure 6D:
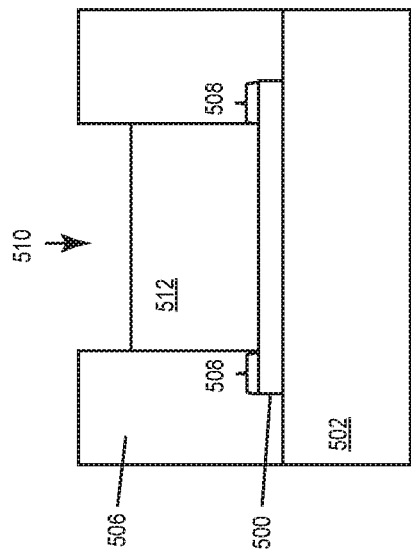
FIGS. 6A through 6E illustrate another embodiment of a method of manufacturing a semiconductor device having a structured, compressive interlayer with a defined crack-stop edge extension.
Figure 6E:
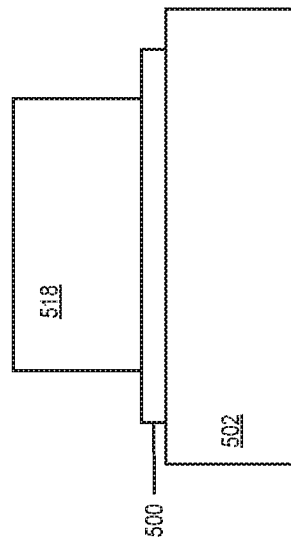
Figure 6A:
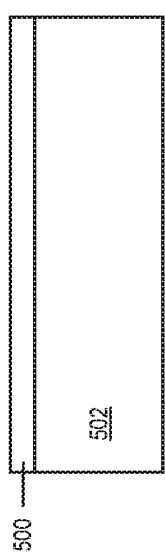
Figure 6B:
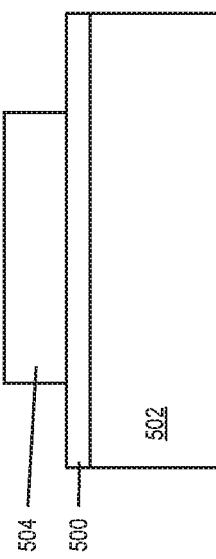
Figure 6C:
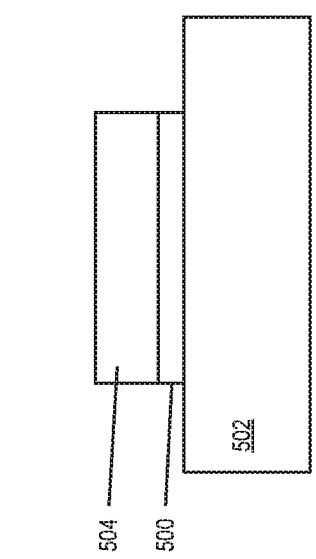

FIGS. 6A through 6E illustrate another embodiment of a method of manufacturing a semiconductor device having a structured, compressive interlayer with a defined crack-stop edge extension. According to this embodiment, the compressive interlayer is structured by dedicated interlayer-lithography before metal deposition. In FIG. 6A, an interlayer material system 500 is deposited on a substrate 502. The interlayer material system 500 comprises one or more material layers and has an overall compressive residual stress at room temperature. In FIG. 6B, a mask 504 such as a photoresist mask is formed on the interlayer material system 500. In FIG. 6C, the exposed part of the interlayer material system 500 is etched selective to the mask 504 to form the structured interlayer before depositing any metal of the structured metallization. The mask 504 is then removed. In FIG. 6D, a second mask 506 such as a photoresist mask is formed on the structured interlayer 500. The second mask 506 covers at least a 0.5 micron periphery 508 around the perimeter of the structured interlayer 500 and has an opening 510 which exposes the structured interlayer 500 inward from the periphery 508. Here, the amount of mask coverage on the periphery 508 of the structured interlayer 500 determines the length of crack-stop edge extension as shown in FIG. 6D. Metal 512 is then deposited in the opening 510 of the second mask 506 to form the structured metallization 518. The mask 506 prevents the metal 512 from being deposited on the periphery 508 of the structured interlayer 500. FIG. 6E shows the resulting device after structure metallization formation.

Figure 7A:
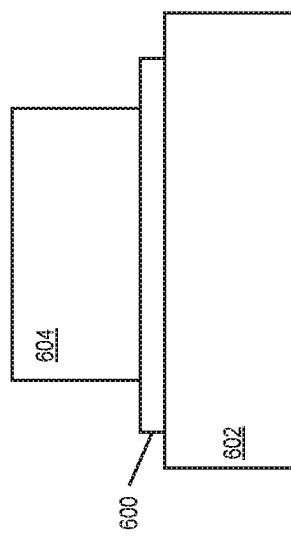
FIGS. 7A through 7E illustrate yet another embodiment of a method of manufacturing a semiconductor device having a structured, compressive interlayer with a defined crack-stop edge extension.
Figure 7C:
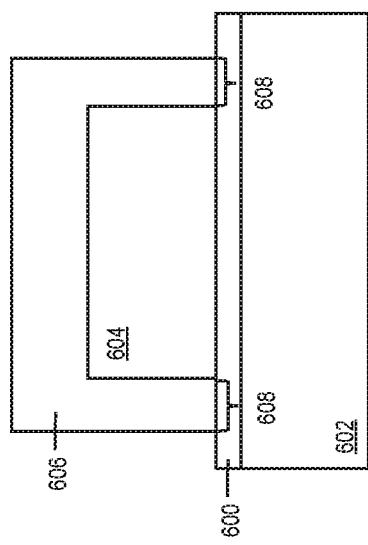
Figure 7E:
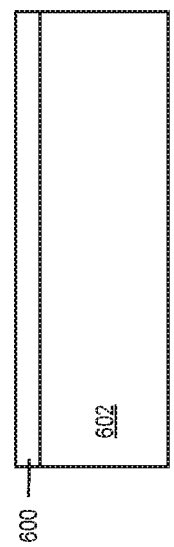
Figure 7B:
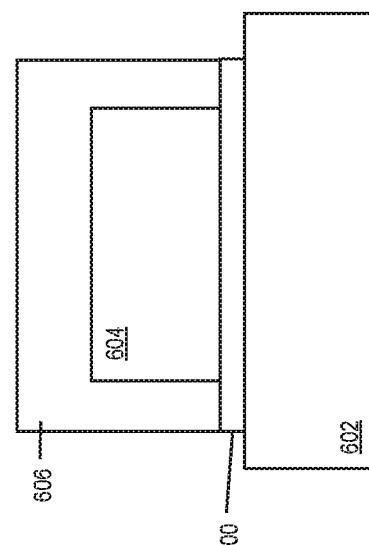
Figure 7D:
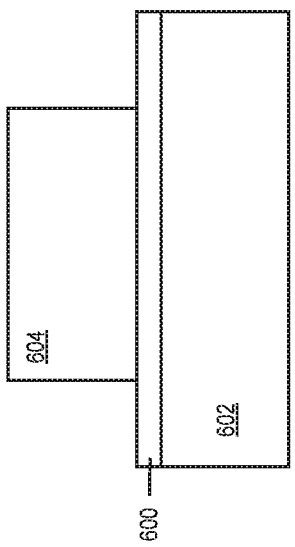

FIGS. 7A through 7E illustrate yet another embodiment of a method of manufacturing a semiconductor device having a structured, compressive interlayer with a defined crack-stop edge extension. According to this embodiment, the compressive interlayer is structured by dedicated interlayer-lithography after metal deposition. In FIG. 7A, an interlayer material system 600 is deposited on a substrate 602. The interlayer material system 600 comprises one or more material layers and has an overall compressive residual stress at room temperature. In FIG. 7B, a structured metallization 604 is formed on the interlayer material system 600 e.g. by standard deposition and lithographic patterning of metal. In FIG. 7C, the structured metallization 604 is covered with a mask 606 such as a photoresist mask. This interlayer-lithography is aligned to the structured metallization 604. The mask 606 is wider than the structured metallization 604, so that the mask 606 extends onto the interlayer material system 600 by at least 0.5 microns beyond the perimeter of the structured metallization 604 as indicated by reference number 608 in FIG. 7C. In FIG. 7D, the part of the interlayer material system 600 unprotected by the mask 606 is removed e.g. by standard selective etching. FIG. 7E shows the device after interlayer material system etching. Here, the length of defined crack-stop edge extension is a function of the amount 608 by which the mask 606 extends onto the interlayer material system 600 as shown in FIGS. 7C and 7D.

FIGS. 8A through 8E illustrate still another embodiment of a method of manufacturing a semiconductor device having a structured, compressive interlayer with a defined crack-stop edge extension. According to this embodiment, the compressive interlayer comprises two layers of different materials. In FIG. 8A, a first interlayer material 700 such as a barrier layer is deposited on a substrate 702 and a second interlayer material 704 such as a seed layer is formed on the first interlayer material 700 to yield a bilayer interlayer 706 having an overall compressive residual stress at room temperature. In FIG. 8B, a mask 708 such as a photoresist mask is formed on the compressive bilayer interlayer 706. In FIG. 8C, the exposed part of the second interlayer material 704 is etched selective to the mask 708 and the first interlayer material 700 before depositing any metal of the structured metallization. The mask 708 is then removed. In FIG. 8D, a second mask 710 such as a photoresist mask is formed on the etched second interlayer material 704. The second mask 710 covers at least a 0.5 micron periphery 712 around the perimeter of the etched second interlayer material 704 and has an opening 714 which exposes the etched second interlayer material 704 inward from the periphery 712. Here, the amount of mask coverage on the periphery 712 of the etched second interlayer material 704 determines the length of crack-stop edge extension. Metal 716 is then deposited in the opening 714 of the second mask 710 to form the structured metallization. The mask 710 prevents the metal 716 from being deposited on the periphery 712 of the etched second interlayer material 704. In FIG. 8E, the second mask 710 is removed and the first (bottom) interlayer material 700 is etched selective to the second (upper) interlayer material 704 and to the metal 716 to form the structured interlayer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a substrate;
a structured interlayer on the substrate and having a defined edge; and
a structured metallization on the structured interlayer and having a defined edge which is immediately adjacent to the defined edge of the structured interlayer and faces the same direction from a plan view perspective of the semiconductor device as the defined edge of the structured interlayer,
wherein the defined edge of the structured interlayer extends beyond the defined edge of the structured metallization by at least 0.5 microns so that the defined edge of the structured metallization terminates before reaching the defined edge of the structured interlayer,
wherein the structured interlayer has a compressive residual stress at room temperature and the structured metallization generates a tensile stress at room temperature that is at least partly counteracted by the compressive residual stress of the structured interlayer.

2. The semiconductor device of claim 1, wherein the substrate is an interlevel dielectric.

3. The semiconductor device of claim 1, wherein the substrate is a semiconductor substrate.

4. The semiconductor device of claim 3, wherein the semiconductor substrate comprises one of Si, GaN on Si, GaN on SiC, GaN on sapphire, and SiC.

5. The semiconductor device of claim 1, wherein the defined edge of the structured interlayer extends beyond the defined edge of the structured metallization by at least 1 micron.

6. The semiconductor device of claim 1, wherein the structured interlayer and the structured metallization are applied over a front side of the substrate, and wherein the defined edge of the structured interlayer extends beyond the defined edge of the structured metallization by more than 0.5 microns and less than 30 microns.

7. The semiconductor device of claim 1, wherein the substrate has a non-planar surface on which the structured interlayer is formed, and wherein the defined edge of the structured interlayer extends beyond the defined edge of the structured metallization by at least 2 microns and less than 30 microns.

8. The semiconductor device of claim 7, wherein the defined edge of the structured interlayer extends beyond the defined edge of the structured metallization by at least 4 microns and less than 15 microns.

9. The semiconductor device of claim 1, wherein the substrate has a non-planar surface on which the structured interlayer is formed, wherein the defined edge of the structured metallization terminates between raised features of the non-planar surface, and wherein the defined edge of the structured interlayer extends beyond the defined edge of the structured metallization by at least 3 microns.

10. The semiconductor device of claim 9, wherein the defined edge of the structured interlayer extends beyond the defined edge of the structured metallization by at least 4 microns.

11. The semiconductor device of claim 1, wherein the substrate has a non-planar surface on which the structured interlayer is formed, wherein the defined edge of the structured metallization terminates over raised features of the non-planar surface, and wherein the defined edge of the structured interlayer extends beyond the defined edge of the structured metallization by at least 3 microns.

12. The semiconductor device of claim 11, wherein the defined edge of the structured interlayer extends beyond the defined edge of the structured metallization by at least 4 microns.

13. The semiconductor device of claim 1, wherein the substrate has a non-planar surface on which the structured interlayer is formed, wherein the defined edge of the structured metallization terminates over a raised feature of the non-planar surface, and wherein the defined edge of the structured interlayer extends beyond the raised feature of the non-planar surface.

14. The semiconductor device of claim 1, wherein the substrate has a planar surface on which the structured interlayer is formed, and wherein the defined edge of the structured interlayer extends beyond the defined edge of the structured metallization by at least 0.5 microns and less than 10 microns.

15. The semiconductor device of claim 1, wherein the structured metallization comprises multiple layers of metal.

16. The semiconductor device of claim 1, wherein the structured metallization is disposed directly on the structured interlayer.

17. The semiconductor device of claim 1, wherein the structured metallization comprises Cu, and wherein the structured interlayer comprises at least one of TiW and W.

18. The semiconductor device of claim 1, wherein the structured metallization comprises Al, and wherein the structured interlayer comprises at least one of TiN and W.

19. The semiconductor device of claim 1, wherein the structured metallization comprises Au.

20. The semiconductor device of claim 1, wherein the structured interlayer comprises a plurality of layers, wherein at least one of the layers has a compressive residual stress at room temperature, wherein at least one of the layers has a tensile residual stress at room temperature, and wherein the structured interlayer has an overall compressive residual stress at room temperature.

21. The semiconductor device of claim 1, wherein the structured interlayer and the structured metallization are applied over a back side of the substrate, and wherein the defined edge of the structured interlayer extends beyond the defined edge of the structured metallization by between 2 microns and 100 microns, or up to 10% of a lateral dimension of the structured metallization in a direction perpendicular to the defined edges of the structured metallization.

22. A method of manufacturing a semiconductor device, the method comprising:
forming a structured interlayer on a substrate, the structured interlayer having a defined edge; and
forming a structured metallization on the structured interlayer, the structured metallization having a defined edge which is immediately adjacent to the defined edge of the structured interlayer and faces the same direction from a plan view perspective of the semiconductor device as the defined edge of the structured interlayer,
wherein the structured interlayer is formed so that the defined edge of the structured interlayer extends beyond the defined edge of the structured metallization by at least 0.5 microns and the defined edge of the structured metallization terminates before reaching the defined edge of the structured interlayer,
wherein the structured interlayer has a compressive residual stress at room temperature and the structured metallization generates a tensile stress at room temperature that is at least partly counteracted by the compressive residual stress of the structured interlayer.

23. The method of claim 22, wherein forming the structured interlayer and forming the structured metallization comprises:
depositing an interlayer material system on the substrate, the interlayer material system having an overall compressive residual stress at room temperature;
depositing and patterning metal on the interlayer material system;
using the deposited and structured metal as a mask to remove the part of the interlayer material system unprotected by the deposited and structured metal; and
laterally etching the deposited and structured metal selective to the interlayer material system so that the defined edge of the interlayer material system extends beyond the defined edge of the deposited and structured metal by at least 0.5 microns.

24. The method of claim 22, wherein forming the structured interlayer comprises:
depositing an interlayer material system on the substrate, the interlayer material system having an overall compressive residual stress at room temperature; and
patterning the interlayer material system to form the structured interlayer before depositing any metal of the structured metallization.

25. The method of claim 24, wherein forming the structured metallization comprises:
forming a mask on the structured interlayer, the mask covering at least a 0.5 micron periphery around the perimeter of the structured interlayer and having an opening which exposes the structured interlayer inward from the periphery; and
depositing metal in the opening of the mask to form the structured metallization, wherein the mask prevents the metal from being deposited on the periphery of the structured interlayer.

26. The method of claim 22, wherein forming the structured interlayer and forming the structured metallization comprises:
depositing a first interlayer material on the substrate and a second interlayer material on the first interlayer material, the first and the second interlayer materials forming a bilayer interlayer having an overall compressive residual stress at room temperature;

etching an exposed part of the second interlayer material selective to the first interlayer material before depositing any metal of the structured metallization;

forming a mask on the etched second interlayer material, the mask covering at least a 0.5 micron periphery around the perimeter of the etched second interlayer material and having an opening which exposes the etched second interlayer material inward from the periphery;

depositing metal in the opening of the mask to form the structured metallization, wherein the mask prevents the metal from being deposited on the periphery of the etched second interlayer material; and etching an exposed part of the first interlayer material selective to the second interlayer material after depositing the metal, to form the structured interlayer.

27. The method of claim 22, wherein forming the structured interlayer comprises:

depositing an interlayer material system on the substrate, the interlayer material system having an overall compressive residual stress at room temperature;

forming the structured metallization on the interlayer material system;

covering the structured metallization with a mask, the mask being wider than the structured metallization so that the mask extends onto the interlayer material system by at least 0.5 microns beyond the perimeter of the structured metallization; and removing the part of the interlayer material system unprotected by the mask.

* * * * *